US012754241B2

(12) United States Patent
Kim

(10) Patent No.: US 12,754,241 B2
(45) Date of Patent: Oct. 6, 2026

(54) CELL VOLTAGE ESTIMATION METHOD AND BATTERY SYSTEM PROVIDING THE SAME

(71) Applicant: LG ENERGY SOLUTION, LTD., Seoul (KR)

(72) Inventor: Kwang Min Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 574 days.

(21) Appl. No.: 18/029,566

(22) PCT Filed: Aug. 2, 2022

(86) PCT No.: PCT/KR2022/011343
§ 371 (c)(1),
(2) Date: Mar. 30, 2023

(87) PCT Pub. No.: WO2023/101136
PCT Pub. Date: Jun. 8, 2023

(65) Prior Publication Data
US 2024/0361388 A1 Oct. 31, 2024

(30) Foreign Application Priority Data
Dec. 1, 2021 (KR) ........................ 10-2021-0169966

(51) Int. Cl.
*G01R 31/367* (2019.01)
*G01R 31/374* (2019.01)
(Continued)

(52) U.S. Cl.
CPC ......... *G01R 31/367* (2019.01); *G01R 31/374* (2019.01); *G01R 31/3842* (2019.01); *G01R 31/389* (2019.01); *G01R 31/396* (2019.01)

(58) Field of Classification Search
CPC ......... B60L 2240/547; B60L 2240/549; B60L 2240/545; B60L 58/16; B60L 58/14;
(Continued)

(56) References Cited

U.S. PATENT DOCUMENTS 5,619,417 A * 4/1997 Kendall ............. G01R 31/3648 701/22
6,020,717 A * 2/2000 Kadouchi .......... G01R 31/3835 320/136
(Continued)

FOREIGN PATENT DOCUMENTS

CN 1668933 A 9/2005
CN 109435775 A 3/2019
(Continued)

OTHER PUBLICATIONS

International Search Report from PCT/KR2022/011343, dated Nov. 9, 2022.
(Continued)

*Primary Examiner* — Catherine T. Rastovski
*Assistant Examiner* — Eric Sebastian Von Wald
(74) *Attorney, Agent, or Firm* — Bryan Cave Leighton Paisner LLP

(57) ABSTRACT

A battery system including: a battery having a plurality of battery cells connected in parallel; a temperature sensor measuring a cell temperature of each of the plurality of battery cells; and a battery management system (BMS). The BMS determines: an estimated cell resistance value corresponding to a measured cell temperature value by using a first look-up table for each of the plurality of battery cells; an estimated cell current value based on the estimated cell resistance value and an estimated cell voltage value estimated during a (N−1)-th estimation period, N being a natural number greater than or equal to 1; an estimated cell capacity
(Continued)

corresponding to the estimated cell current value by using a capacity estimation model; and the estimated cell voltage value corresponding to the estimated cell capacity as the estimated cell voltage value during an N-th estimation period using a second look-up table.

15 Claims, 4 Drawing Sheets

(51) Int. Cl.
*G01R 31/3842* (2019.01)
*G01R 31/389* (2019.01)
*G01R 31/396* (2019.01)

(58) Field of Classification Search
CPC .. B60L 58/15; B60L 58/22; B60L 3/12; B60L 50/64; B60L 58/12; B60L 58/18; G01R 31/367; G01R 31/36; G01R 31/389; G01R 31/396; G01R 31/3842; G01R 31/382; G01R 31/374; G01R 31/3648; G01R 19/16542; G01R 31/392; G01R 31/387; H01M 2010/4271; H01M 2010/4278; H01M 10/425; H01M 10/48; H01M 10/482; H01M 10/486; H01M 10/42; H01M 10/441; H01M 2220/20; H01M 10/443; H01M 10/4207; H01M 10/44; H01M 50/569; H01J 7/0048; H02J 7/0013; H02J 7/0014; H02J 7/007
See application file for complete search history.

(56) References Cited

U.S. PATENT DOCUMENTS 6,444,350 B1 * 9/2002 Toya .................. H01M 10/482
429/62
8,583,389 B2 11/2013 Aoshima et al.
9,893,385 B1 * 2/2018 Nayar ................ H01M 10/399
2005/0269991 A1 12/2005 Mitsui et al.
2008/0091362 A1 4/2008 Tae et al.
2013/0026989 A1 * 1/2013 Gibbs .................... B60L 58/15
320/116
2016/0245871 A1 8/2016 Joe
2017/0054134 A1 2/2017 Choi et al.
2020/0295407 A1 9/2020 Bober
2020/0412146 A1 * 12/2020 Takechi ................. H02J 7/005
2021/0123980 A1 4/2021 Kataoka et al.
2021/0175485 A1 * 6/2021 Sieber ................ H01M 10/657
2021/0199724 A1 7/2021 Kim
2021/0215769 A1 * 7/2021 Chow .............. H01M 10/0565
2021/0288353 A1 * 9/2021 Gottapu ............... G01R 31/367
2021/0399554 A1 * 12/2021 Sherstyuk ............ H02J 7/0014
2021/0408618 A1 * 12/2021 Soto ................... H01M 10/486
2022/0221516 A1 * 7/2022 Lee ...................... G01R 31/367
2022/0289030 A1 * 9/2022 Pressman ........... H01M 10/633
2023/0050393 A1 * 2/2023 Stroud ................. H01M 50/24

FOREIGN PATENT DOCUMENTS

| | | | |
|---|---|---|---|
| CN | 112534283 | A | 3/2021 |
| JP | 2004-028861 | A | 1/2004 |
| JP | 2009-059504 | A | 3/2009 |
| JP | 2011-027608 | A | 2/2011 |
| JP | 4918895 | B2 | 4/2012 |
| JP | 4945206 | B2 | 6/2012 |
| JP | 2018-091701 | A | 6/2018 |
| KR | 10-0814883 | B1 | 3/2008 |
| KR | 10-2013-0129508 | A | 11/2013 |
| KR | 10-2016-0059193 | A | 5/2016 |
| KR | 10-1650415 | B1 | 8/2016 |
| KR | 101707150 | B1 | 2/2017 |
| KR | 10-2020-0110615 | A | 9/2020 |
| KR | 10-2151652 | B1 | 9/2020 |
| KR | 10-2163764 | B1 | 10/2020 |

OTHER PUBLICATIONS

Written Opinion of the ISA from PCT/KR2022/011343, dated Nov. 9, 2022.

* cited by examiner

CELL VOLTAGE ESTIMATION METHOD AND BATTERY SYSTEM PROVIDING THE SAME

CROSS-REFERENCE TO RELATED APPLICATION

This application is a National Phase entry pursuant to 35 U.S.C. 371 of International Application PCT/KR2022/011343 filed on Aug. 2, 2022, which claims priority to and the benefit of Korean Patent Application No. 10-2021-0169966 filed in the Korean Intellectual Property Office on Dec. 1, 2021, the entire contents of which are incorporated herein by reference.

TECHNICAL FIELD

The present disclosure relates to a cell voltage estimation method for estimating a cell voltage of each of a plurality of battery cells connected in parallel and to a battery system providing the method.

BACKGROUND

As a usage period of a battery including a plurality of battery cells increases, a deviation (a voltage, SOC, etc.) between the battery cells may increase. If the cell-to-cell deviation increases, the battery may be over-discharged and/or overcharged. If the overcharge/over-discharge is repeated, the aging of the battery accelerates, and various problems such as an increase in the possibility of causing a fire may occur. To solve this, a battery management system (BMS) calculates the cell deviation at a predetermined cycle, and performs cell balancing when the cell deviation exceeds a reference value.

When a plurality of battery cells are connected in series, a monitoring IC is electrically connected to each of a plurality of battery cells to measure the cell voltage, and transmits the measurement result to the MCU. The MCU may calculate the voltage deviation or the SOC deviation between a plurality of battery cells based on the cell voltage, and control the monitoring IC to perform the cell balancing.

On the other hand, when a plurality of battery cells are connected in parallel, there is a limit in that the cell voltage cannot be directly measured due to a problem such as a narrow space or a cost according to the characteristic of the in parallel connection. In addition, in the case of in parallel connection, the cell balancing was not performed in many cases in the existing battery system in anticipation of a self-balancing effect between a plurality of battery cells.

However, even between a plurality of battery cells connected in parallel, the resistance of each battery cell may vary due to various causes. As a result, a cell voltage difference may occur due to the difference in the amount of the current applied to each battery cell, and the deviation between the cells may increase according to the cell voltage difference.

For example, when each of a plurality of battery modules connected in series includes a plurality of battery cells connected in parallel, it is difficult to directly measure the cell voltage value of each of a plurality of battery cells connected in parallel. Accordingly, the BMS determines whether to perform module balancing based on the module voltage value, which is the voltage (a terminal voltage) value at both terminals of the battery module that may be directly measured. In this case, the cell voltage value of each of a plurality of battery cells included in each battery module may not be considered, so that the over-discharge and/or the overcharge of some battery cells may occur.

The background description provided herein is for the purpose of generally presenting context of the disclosure. Unless otherwise indicated herein, the materials described in this section are not prior art to the claims in this application and are not admitted to be prior art, or suggestions of the prior art, by inclusion in this section.

SUMMARY

The present disclosure provides a cell voltage estimation method capable of estimating the cell voltage of each of a plurality of battery cells even when a plurality of battery cells are connected in parallel, and a battery system providing the method.

A battery system of the present disclosure includes: a plurality of battery cells connected in parallel; a temperature sensor measuring a cell temperature of each of the plurality of battery cells; and a BMS (battery management system) determining an estimated cell resistance value corresponding to a measured cell temperature value by using a first look-up table for each of the plurality of battery cells, determining an estimated cell current value based on the estimated cell resistance value and an estimated cell voltage value estimated during an (N−1)-th estimation period, N being a natural number greater than or equal to 1, determining an estimated cell capacity (SOC, State of Charge) corresponding to the estimated cell current value by using a capacity estimation model, and determining the estimated cell voltage value corresponding to the estimated cell capacity as the estimated cell voltage value during an N-th estimation period using a second look-up table.

The first look-up table may include the estimated cell resistance value corresponding to a predetermined cell temperature value, the capacity estimation model may determine the cell capacity corresponding to a predetermined cell current value, and the second look-up table may include a cell voltage (OCV, Open Circuit Voltage) value corresponding to a predetermined cell capacity.

A battery system of the present disclosure includes: a battery including a plurality of battery modules connected in series, each of the plurality of battery modules comprising a plurality of battery cells connected in paralle; a temperature sensor measuring a cell temperature of each of the plurality of battery cells; and a BMS (battery management system) determining an estimated cell resistance value corresponding to a measured cell temperature value by using a first look-up table for each of the plurality of battery cells, determining an estimated cell current value based on the estimated cell resistance value and an estimated cell voltage value determined during an (N−1)-th estimation period, determining a cell capacity (SOC, State of Charge) corresponding to the estimated cell current value by using a capacity estimation model, and determining the estimated cell voltage value corresponding to the estimated cell capacity as the estimated cell voltage value during an N-th estimation period using a second look-up table, wherein the BMS determines whether to perform a module balancing between each of the plurality of battery modules connected in series based on the estimated cell voltage value for each of the plurality of battery cells.

The BMS may determine a modue voltage value of each of the plurality of battery modules based on a minimum cell voltage value among a plurality of cell voltage values of the plurality of battery cells included in each of the plurality of battery modules and determine whether to perform the module balancing based on the module voltage value.

The first look-up table may include a cell resistance value corresponding to a predetermined cell temperature value, the capacity estimation model may determine the estimated cell capacity corresponding to a predetermined cell current value, and the second look-up table may include a cell voltage (OCV, Open Circuit Voltage) value corresponding to a predetermined cell capacity.

A method for determining an estimated cell voltage value for each of a plurality of battery cells in a battery system, the battery system including a plurality of battery modules connected in series and the plurality of battery cells connected in parallel for each of a plurality of battery modules, the method includes: receiving a measured cell temperature value of each of the plurality of battery cells; determining an estimated cell resistance value corresponding to the measured cell temperature value by using a first look-up table; determining an estimated cell current value based on an estimated cell resistance value and an estimated cell voltage value during an (N−1)-th estimation period; determining an estimated cell capacity (SOC, State of Charge) corresponding to the estimated cell current value by using a capacity estimation model; and determining the estimated cell voltage value corresponding to the estimated cell capacity using a second look-up table during an N-th estimation period.

The method for estimating the cell voltage value may further include, after determining the estimated cell voltage value, determining whether to perform a module balancing between the plurality of battery modules based on the estimated cell voltage value for each of the plurality of battery cells.

Whether to perform the module balancing may be determined based on a minimum cell voltage value, a module voltage of each of the plurality of battery modules may be determined based on a minium cell voltage value among a plurality of cell voltage values of the plurality of battery cells included in each of the plurality of battery modules, and whether to perform the module balancing may be determined based on the module voltage value.

The method for estimating the cell voltage value may further include, upon determining performing of the module balancing is required, performing the module balancing based on a lowest module voltage value among module voltage values of the plurality of battery modules.

The first look-up table may include a cell resistance value corresponding to a predetermined cell temperature value, the capacity estimation model may determine the estimated cell capacity corresponding to a predetermined cell current value, and the second look-up table may include a cell voltage (OCV, Open Circuit Voltage) value corresponding to the predetermined cell capacity.

In the present disclosure, even when a plurality of battery cells are connected in parallel, the cell voltage of each of a plurality of battery cells may be estimated.

In the present disclosure, when each of a plurality of battery modules connected in series includes a plurality of battery cells connected in parallel, some battery cells may be prevented from being over-discharged and/or overcharged by controlling the module balancing based on the estimated cell voltage value.

The effects of the present disclosure are not limited to the effects mentioned above and additional other effects not described above will be clearly understood from the description of the appended claims by those skilled in the art.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION

Figure 1:
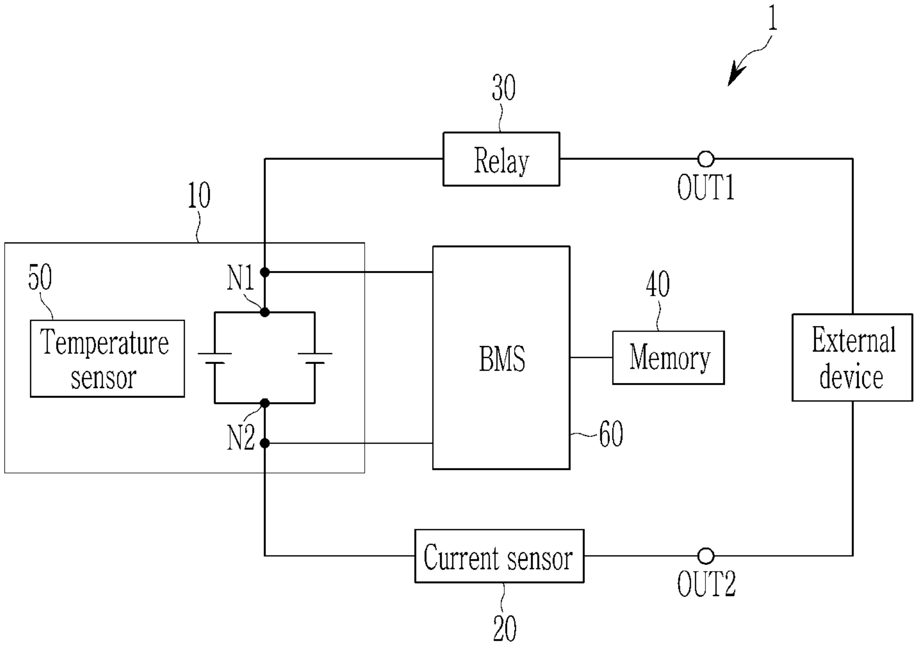
FIG. 1 is a view illustrating a battery system including a plurality of battery cells connected in parallel according to an embodiment.

Hereinafter, an embodiment disclosed the present specification will be described in detail with reference to the accompanying drawings, and the same or similar constituent factors are denoted by the same reference numerals regardless of a reference numeral, and a repeated description thereof will be omitted. Suffixes "module" and/or "unit" for a constituent factor used for the description below are given or mixed in consideration of only easiness of the writing of the specification, and the suffix itself does not have a discriminated meaning or role. Further, in describing the embodiment disclosed in the present disclosure, when it is determined that detailed description relating to well-known functions or configurations may make the subject matter of the embodiment disclosed in the present disclosure unnecessarily ambiguous, the detailed description will be omitted. Further, the accompanying drawings are provided for helping to easily understand embodiments disclosed in the present specification, and the technical spirit disclosed in the present specification is not limited by the accompanying drawings, and it will be appreciated that the present disclosure includes all of modifications, equivalent matters, and substitutes included in the spirit and the technical scope of the present disclosure.

Terms including an ordinal number, such as first and second, are used for describing various constituent factors, but the constituent factors are not limited by the terms. The terms are used only to discriminate one constituent factor from another constituent factor.

It should be understood that when one constituent factor is referred to as being "coupled to" or "connected to" another constituent factor, one constituent factor can be directly coupled to or connected to the other constituent factor, but intervening factors may also be present. By contrast, when one constituent factor is referred to as being "directly coupled to" or "directly connected to" another constituent factor, it should be understood that there are no intervening factors.

In the present application, it will be appreciated that terms "including" and "having" are intended to designate the existence of characteristics, numbers, steps, operations, constituent factors, and components described in the specification or a combination thereof, and do not exclude a possibility of the existence or addition of one or more other characteristics, numbers, steps, operations, constituent factors, and components, or a combination thereof in advance.

Figure 2:
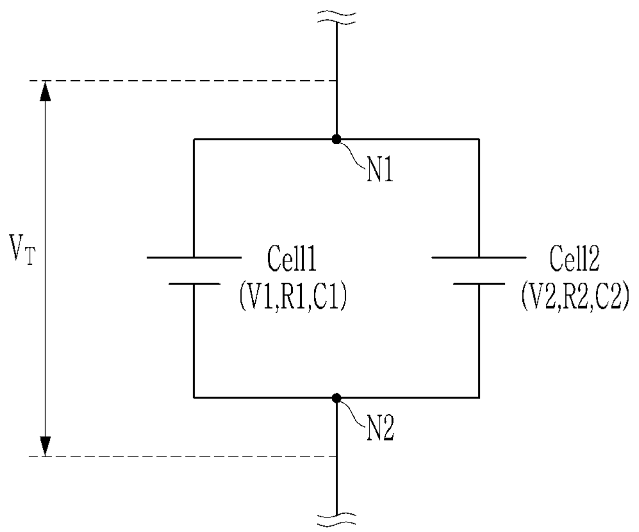
FIG. 2 is an example diagram for explaining a method of estimating a cell voltage of each of two battery cells connected in parallel according to an embodiment.
Figure 3:
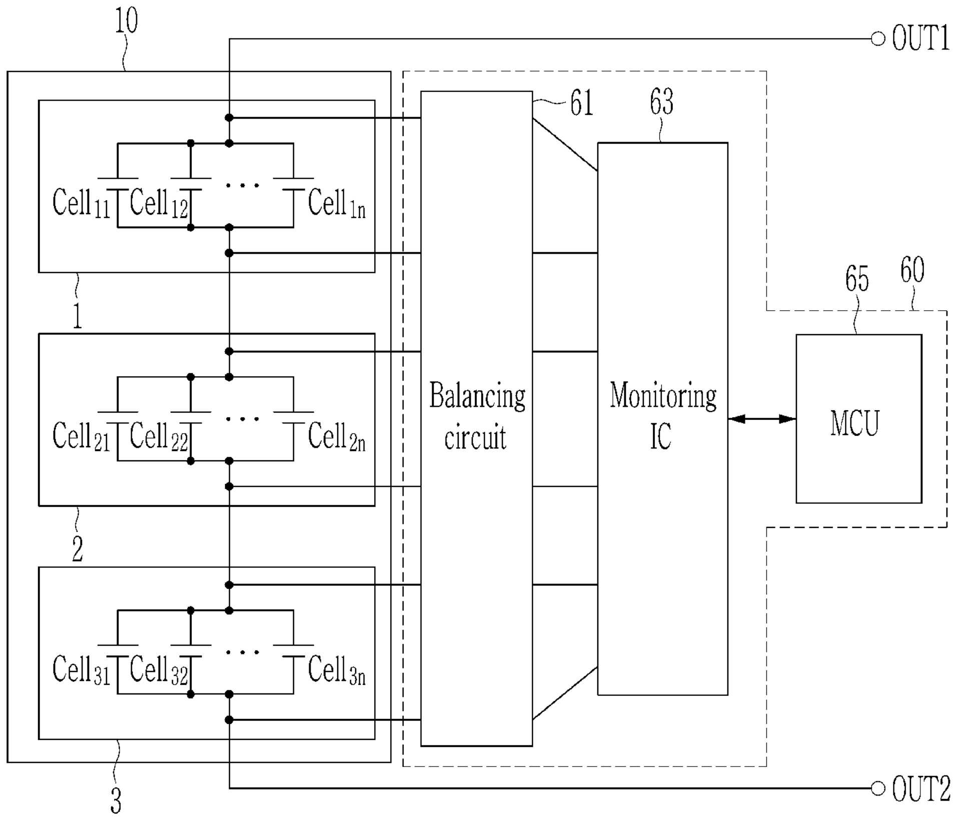
FIG. 3 is a view illustrating a battery system in which a plurality of battery modules including a plurality of battery cells connected in parallel are connected in series according to another embodiment.

FIG. 1 is a view illustrating a battery system including a plurality of battery cells connected in parallel according to an embodiment, FIG. 2 is an example diagram for explaining a method of estimating a cell voltage of each of two battery cells connected in parallel according to an embodiment, and FIG. 3 is a view illustrating a battery system in which a plurality of battery modules including a plurality of battery cells connected in parallel are connected in series according to another embodiment.

Referring to FIG. 1, a battery system 1 includes a battery 10, a current sensor 20, a relay 30, a memory 40, a temperature sensor 50, and a battery management system (hereinafter referred to as 'BMS') 60.

The battery 10 may include a plurality of battery cells $Cell_1$ to $Cell_n$ electrically connected in parallel. In some embodiments, the battery cell may be a rechargeable battery that is rechargeable. Also, referring to FIG. 3, the battery 10 may be configured such that a plurality of battery modules 1, 2, and 3 including a plurality of battery cells $Cell_1$ to $Cell_n$ that are electrically connected in parallel are connected in series. However, the present disclosure is not limited thereto, and the battery 10 may be configured such that a plurality of battery modules 1, 2, and 3 including a plurality of battery cells $Cell_1$ to $Cell_n$ are connected in series/in parallel.

Both terminals of the battery 10 may be electrically connected to the BMS 60. The BMS 60 can measure the voltage (hereinafter, a terminal voltage) across both ends of the battery 10. Alternatively, a voltage sensor (not shown) may measure the terminal voltage (Voltage Terminal, $V_T$) and transmit the measurement result to the BMS 60. Referring to FIG. 3, both terminals of each of a plurality of battery modules 1-3 may be electrically connected to the BMS 60. The BMS 60 may measure a voltage across both terminals (hereinafter, a terminal voltage) of each of a plurality of battery modules 1-3.

The terminal voltage $V_T$ may be a voltage between the positive and negative electrodes of a plurality of battery cells connected in parallel. When a sufficient time elapses to perform self-balancing of a plurality of battery cells, the terminal voltage ($V_T$) value and the cell voltage value of a plurality of battery cells $Cell_1$ to $Cell_n$ may be the same. Therefore, for example, the terminal voltage VT in FIG. 1 may be the voltage across both terminals of the battery 10. Also, the terminal voltage $V_T$ in FIG. 3 may be a module voltage that is the voltage across both terminals of a battery module (j) including a plurality of battery cells $Cell_1$ to $Cell_n$ connected in parallel. Therefore, in each of the first battery module 1, the second battery module 2, and the third battery module 3, which are connected in series in FIG. 3, the terminal voltage $V_T$ value may be different.

Unlike as shown in FIG. 1, when a plurality of battery cells $Cell_1$ to $Cell_n$ are connected in parallel, it is difficult to directly measure the cell voltage of each of a plurality of battery cells $Cell_1$ to $Cell_n$ due to the structural characteristics. In the battery system 1 according to an embodiment, the cell voltage value of each of a plurality of battery cells $Cell_1$ to $Cell_n$ may be estimated according to the method described in FIG. 4.

In FIG. 1, the battery 10 is connected between two output terminals OUT1 and OUT2 of the battery system 1, the relay 30 is connected between the positive electrode of the battery system 1 and the first output terminal OUT1, and the current sensor 20 is connected between the negative electrode of the battery system 1 and the second output terminal OUT2. The components shown in FIG. 1 and a connection relationship between the components are an example and the present disclosure but are not limited thereto.

The current sensor 20 is connected in series to the current path between the battery 10 and an external device. The current sensor 20 may measure the terminal current I flowing through the battery 10, that is, the charging current and the discharge current, and transmit the measurement result to the BMS 60. According to an embodiment, the current value measured by the current sensor 20 may correspond to the summed current value of the cell currents $I_1$ to $I_n$ flowing in each of a plurality of battery cells $Cell_1$ to $Cell_n$ connected in parallel.

The relay 30 controls the electrical connection between the battery system 1 and an external device. When the relay 30 is turned on, the battery system 1 and the external device are electrically connected to perform the charge or the discharge, and when the relay 30 is turned off, the battery system 1 and the external device are electrically disconnected. In this case, the external device may be a charger in a charging cycle in which the battery 10 is charged by supplying the power, and may be a load in a discharge cycle in which the battery 10 discharges the power to the external device.

The memory 40 may store a first look-up table including a cell resistance value corresponding to a predetermined cell temperature value, a capacity estimation model for estimating a cell capacity (SOC, State of Charge) based on the cell current value, and a second look-up table including the cell voltage value corresponding to the predetermined capacity (SOC).

The first look-up table may be stored by mapping a cell resistance value corresponding to a predetermined cell temperature value experimentally obtained for a predetermined battery cell model. That is, the first look-up table may be a look-up table based on a temperature-resistance correlation. The capacity estimation model may be a model for estimating the cell capacity (SOC) by various other conventionally known methods, such as based on a method such as a current integration method (Coulomb Counting, Ampere Counting). The second look-up table may be a table in which a state of charge (SOC) value and an open circuit voltage (OCV) value are matched.

The temperature sensor 50 may measure a cell temperature ($C_1$-$C_n$) of each of a plurality of battery cells $Cell_1$ to $Cell_n$ and transmit the measurement result to the BMS 60. In FIG. 1, only one temperature sensor 50 is displayed, but the present disclosure is not limited thereto, and the cell temperature ($C_1$-$C_n$) of each of a plurality of battery cells $Cell_1$ to $Cell_n$ may be measured in various numbers and shapes.

The BMS 60 may measure the terminal voltage $V_T$. Hereinafter, it is described that the BMS 60 measures the terminal voltage $V_T$, but this is not limited thereto, and a voltage sensor (not shown) may include measuring the terminal voltage $V_T$.

Referring to FIG. 3, the BMS 60 may include a balancing circuit 61, a monitoring IC 63, and an MCU 65.

The balancing circuit 61 may reduce a voltage deviation (or a SOC deviation) between the battery modules 1 to 3 by performing the module balancing between the battery modules 1 to 3.

The monitoring IC 63 may measure a module voltage of each of a plurality of battery modules 1 to 3 for each predetermined estimation period T, and transmit the measurement result to the MCU 65. According to an embodiment, the module voltage of each of a plurality of battery modules 1 to 3 may be the terminal voltage $V_T$ necessary for estimating the cell voltage of a plurality of battery cells included in each of a plurality of battery modules 1 to 3.

The MCU 65 may estimate the cell voltage $V_1$-$V_n$ value of each of a plurality of battery cells connected in parallel based on the terminal voltage $V_T$ and the cell temperature C measured for each predetermined estimation period T.

Referring to FIG. 3, for example, the MCU 65 estimates the cell voltage $V_1$-$V_n$ value of each of a plurality of battery cells $Cell_1$ to $Cell_n$ included in each of a plurality of battery modules 1 to 3 for each predetermined estimation period Tj. The MCU 65 may determine the necessity of the module balancing for a plurality of battery modules 1 to 3 based on the estimated cell voltage ($V_1$-$V_n$) value. After that, if the module balancing is necessary as the determination result, the MCU 65 may control the balancing circuit 61 to control the module balancing between battery modules 1 to 3. The more detailed description is described in FIG. 4 below.

FIG. 2 is an example diagram for explaining a method of estimating a cell voltage of each of two battery cells connected in parallel according to an embodiment.

FIG. 2 shows two battery cells, but the present disclosure is not limited thereto, and the cell voltage of each of two or more battery cells may be estimated by the method described below.

Referring to FIG. 1 and FIG. 2, the BMS 60 receives the first temperature $TI_N$ and the second temperature $T2_N$, which are the respective cell temperatures of the first battery cell $Cell_1$ and the second battery cell $Cell_2$ for each predetermined estimation period $T_1, \ldots, T_{N-1}$, and $T_N$ from the temperature sensor 50. The following description is described based on a predetermined estimation period $T_N$.

The temperature sensor 50 may measure the cell temperature of each of the first battery cell $Cell_1$ and the second battery cell $Cell_2$ per the predetermined estimation period $T_1, \ldots, T_{N-1}, T_N$ and may transmit the measurement result to the BMS 60.

Next, the BMS 60 estimates a first resistance $R1_N$ and a second resistance $R2_N$ respectively corresponding to each of a first temperature $T1_N$ and a second temperature $T2_N$ based on the first look-up table in which the temperature-resistance relationship stored in memory 40 is recorded. In this case, the first resistance $R1_N$ and the second resistance $R2_N$ may correspond to the cell resistances of the first battery cell $Cell_1$ and the second battery cell $Cell_2$, respectively.

Next, the BMS 60 calculates the cell current value of each of the first battery cell $Cell_1$ and the second battery cell $Cell_2$ from the current estimation period $T_N$ based on the cell voltage value of the previous estimation period $T_{N-1}$ and the cell resistance value of the current estimation period $T_N$.

The current and the voltage are closely related to the passage of time. That is, the current value at a predetermined estimation time (e.g., an N time) is closely related to the voltage value of the previous estimation time N−1. From this point of view, if the concept of the time is added to Ohm's law, it may be as shown in Equations 1 and 2 below.

$$V1_{N-1} = I1_N \times R1_N \quad \text{(Equation 1)}$$

$$V2_{N-1} = I2_N \times R2_N \quad \text{(Equation 2)}$$

According to an embodiment, the BMS 60 may calculate the first current I1 value and the second current I2 value in the current estimation period $T_N$ for the first battery cell $Cell_1$ and the second battery cell $Cell_2$, respectively, based on Equations 1 and 2.

In Equation 1, it shows that the first current $I1_N$ value, which is the cell current of the first battery cell $Cell_1$, may be calculated in the current estimation period $T_N$ by applying the first voltage $V1_{N-1}$ value of the previous estimation period $T_{N-1}$ and the first resistance $R1_N$ value of the current estimation period $T_N$ to Ohm's law.

In Equation 2, it shows that the second current $I2_N$ value, which is the cell current of the second battery cell $Cell_2$, may be calculated in the current estimation period $T_N$ by applying the value of the second voltage $V2_{N-1}$ of the previous estimation period $T_{N-1}$ and the value of the second resistance $R2_N$ of the current estimation period $T_N$ to Ohm's law.

In Equations 1 and 2, the first voltage $V1_{N-1}$ value and the second voltage $V2_{N-1}$ value of the last estimation time N−1 may be pre-estimated and stored in the memory 40. Also, the first resistance $R1_N$ value and the second resistance $R2_N$ value of the current estimation period $T_N$ may be pre-estimated and stored in the memory 40.

In a 0th estimation period $T_0$, it is assumed that the battery cells are in an initial state in which the battery cells are not used, or a plurality of battery cells $Cell_1$ to $Cell_n$ sufficiently perform the self-balancing and then each state of a plurality of cells $Cell_1$ to $Cell_n$ connected in parallel is the same. That is, the terminal voltage $VT_0$ value may be the same as both the first voltage $V1_0$ and the second voltage $V2_0$ value ($VT_0=V1_0=V2_0$). The BMS 60 may store the terminal voltage $VT_0$ value measured in the 0th estimation period $T_0$ in the memory 40 as the first voltage $V1_0$ value and the second voltage $V2_0$ value.

Next, the BMS 60 may estimate the first state of charging $SOC1_1$ and the second state of charging $SOC2_1$ by applying the first current $I1_1$ value and the second current $I2_1$ value to the capacity estimation model. In this case, the first state of charging $SOC1_1$ and the second state of charging $SOC2_1$ may correspond to the cell capacities of the first battery cell $Cell_1$ and the second battery cell $Cell_2$, respectively.

For example, the capacity estimation model may be an estimation model to which a current integration method is applied, but is not limited thereto. The capacity estimation model may include an estimation model to which various methods of estimating the cell voltage based on the cell current are applied.

Next, the BMS 60, based on the second look-up table in which the SOC-OCV relationship stored in the memory 40 is recorded, estimates the first voltage $V1_N$ value and the second voltage $V2_N$ value corresponding to each of the first state of charging $SOC1_1$ and the second state of charging $SOC2_1$. In this case, the first voltage $V1_N$ and the second voltage $V2_N$ may correspond to the cell voltages of the first battery cell $Cell_1$ and the second battery cell $Cell_2$, respectively.

Figure 4:
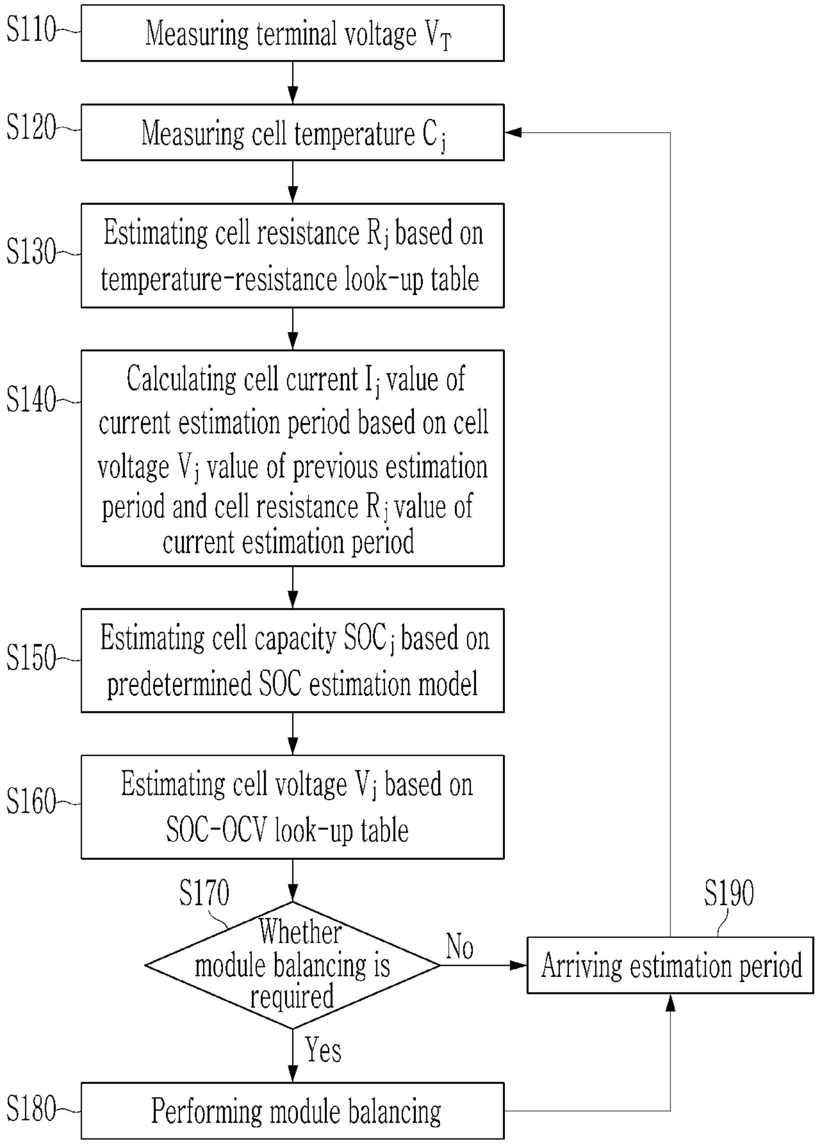
FIG. 4 is a flowchart explaining a cell voltage estimation method according to another embodiment.

FIG. 4 is a flowchart explaining a cell voltage estimation method according to another embodiment.

Hereinafter, the cell voltage estimation method and the battery system providing the method are described in detail with reference to FIG. 1 to FIG. 4. Also, In FIG. 3, only three battery modules 1, 2, and 3 are illustrated, but the present disclosure is not limited thereto, and the battery 10 may include more battery modules.

Referring to FIG. 3 and FIG. 4, the BMS 60 measures the terminal voltage $V_T$ that is the voltage across both terminals of a plurality of battery modules 1 to 3, respectively (S110).

Hereinafter, the method of estimating the cell voltage of each of a plurality of battery cells $Cell_{11}$-$Cell_{1n}$ included in the first battery module 1 is described, but the cell voltage of a plurality of battery cells included in each of the second battery module 2 and the third battery module 3 may be estimated by the same method.

In a 0th estimation period $T_0$, it is assumed that the battery cells are in an initial state in which the battery cells are not used, or a plurality of battery cells $Cell_1$ to $Cell_n$ sufficiently perform the self-balancing and then each state of a plurality of cells $Cell_1$ to $Cell_n$ connected in parallel is the same. That is, the terminal voltage $VT_0$ value may be equal to the cell voltage value of each of a plurality of cells $Cell_{11}$-$Cell_{1n}$ in the 0th estimation period $T_0$ ($V_{T0}=V1_{10}, \ldots, =V1_{n0}$).

According to an embodiment, the step (S110) may be a step performed in the 0th estimation period $T_0$. The BMS 60 may store the measured terminal voltage $V_{T0}$ value in the memory 40 as the cell voltage value of each of a plurality of cells $Cell_{11}$-$Cell_{1n}$ in the 0th estimation period $T_0$.

Next, the BMS 60 receives a cell temperature value of each of a plurality of battery cells $Cell_{11}$-$Cell_{1n}$ from the temperature sensor 50 (S120).

The temperature sensor 50, for each predetermined estimation period $T_1, \ldots, T_{N-1}, T_N$, may measure the cell temperature of each of a plurality of battery cells $Cell_{11}$ to $Cell_{1n}$, and transmit the measurement result to the BMS 60. Hereinafter, unless otherwise specified, the steps and values performed in the N-th estimation period may be used. In this case, N is a natural number of greater than or equal to 1.

Next, the BMS 60 estimates a cell resistance value of each of a plurality of cells $Cell_{11}$ to $Cell_{1n}$ based on the measured cell temperature value and the first look-up table (S130).

For example, the BMS 60 may find a cell resistance value mapped to the cell temperature value of each of a plurality of cells $Cell_{11}$ to $Cell_{1n}$ in the first look-up table, and estimate the cell resistance value of each of a plurality of cells $Cell_{11}$ to $Cell_{1n}$.

Next, the BMS 60 calculates the cell current value of each of a plurality of cells $Cell_{11}$ to $Cell_{1n}$ in the current estimation period $T_N$ based on the cell voltage value of the previous estimation period $T_{N-1}$ and the cell resistance value of the current estimation period $T_N$ (S140).

The current and the voltage are closely related to the passage of time. That is, the current value at the predetermined estimation time (e.g., the N time) is closely related to the voltage value of the previous estimation time N−1. From this point of view, adding the concept of time to Ohm's law may be the same as Equations 1 and 2.

According to an embodiment, the BMS 60 may calculate the cell current value in the current estimation period $T_N$ for a plurality of cells $Cell_{11}$ to $Cell_{1n}$, respectively, based on Equations 1 and 2, and the like.

Next, the BMS 60 estimates the cell capacity of each of a plurality of cells $Cell_{11}$ to $Cell_{1n}$ by applying the cell current value of each of the plurality of cells $Cell_{11}$ to $Cell_{1n}$ to the capacity estimation model (S150).

For example, the capacity estimation model may be an estimation model to which a current integration method is applied, but is not limited thereto. The capacity estimation model may include an estimation model to which various methods of estimating the cell voltage based on the cell current are applied.

Next, the BMS 60 estimates the cell voltage value of each of a plurality of cells $Cell_{11}$ to $Cell_{1n}$ based on the estimated cell capacity and the second look-up table (S160).

Referring to FIG. 3, for example, the BMS 60 may estimate the cell voltage value of a plurality of battery cells included in each of a plurality of battery modules 1 to 3, and store the estimated cell voltage value in the memory 40.

Next, the BMS 60 determines the necessity of the module balancing between a plurality of battery modules 1 to 3 connected in series based on the estimated cell voltage value (S170).

According to an embodiment, the BMS 60 may determine the minimum cell voltage value among the cell voltage values of a plurality of battery cells included in the predetermined battery module as the module voltage value of the corresponding battery module, and determine the necessity of the module balancing.

For example, it is assumed that the estimated cell voltage values of each of the first to third battery cells included in the first battery module 1 are 4.0 V, 3.6 V, and 4.0 V, and the terminal voltage $V_T$ value of the voltage across both terminals of the first battery module 1 is measured as 4.0 V, and conventionally, the voltage value of the first battery module 1 is determined as the measured terminal voltage $V_T$ value (4.0 V), and the voltage value of the first battery module 1 has no deviation (or less) for the voltage value of the second battery module 2 and the third battery module 3 (e.g., 4.0 V, respectively), so that it was determined that the module balancing was not necessary. Then, a problem such as accelerated aging of the second battery cell ($Cell_{12}$) included in the first battery module 1 may occur due to over-discharge/overcharge.

The BMS 60 according to an embodiment, estimates the minimum cell voltage value (e.g., 3.6 V) among the cell voltage values of the first to third battery cells $Cell_{11}$-$Cell_{13}$ included in the first battery module 1 as the voltage value of the first battery module 1, and compares the voltage value of the first battery module 1 (e.g., 3.6 V) with the voltage value of the second battery module 2 and the third battery module 3 (e.g., 4.0 V, respectively), thereby determining that the module balancing is necessary.

Next, if the module balancing is required (S170, Yes), the BMS 60 performs the module balancing (S180).

The BMS 60 may perform the module balancing by using various conventionally known balancing methods.

Next, if the module balancing is not required (S170, No) or the module balancing is terminated, the BMS 60 counts the next estimation period $T_{N+1}$, and when the next estimation period $T_{N+1}$ arrives, the process is repeated from the step S120 (S190).

While this disclosure has been described in connection with what is presently considered to be practical embodiments, it is to be understood that the disclosure is not limited to the disclosed embodiments. On the contrary, it is intended to cover various modifications and equivalent arrangements included within the spirit and scope of the appended claims.

The invention claimed is:

1. A battery system comprising:

a battery including a plurality of battery cells connected in parallel;

a temperature sensor to measure a cell temperature of each of the plurality of battery cells during a N-th estimation period; and a battery management system (BMS), wherein the BMS is configured to determine an estimated cell resistance value corresponding to a measured cell temperature value by using a first look-up table for each of the plurality of battery cells, wherein the BMS is configured to calculate an estimated cell current value using the estimated cell resistance value and an estimated cell voltage value estimated during a (N−1)-th estimation period, N being a natural number greater than or equal to 1, wherein the BMS is configured to determine an estimated cell capacity corresponding to the estimated cell current value by using a capacity estimation model, and wherein the BMS is configured to determine the estimated cell voltage value corresponding to the estimated cell capacity as the estimated cell voltage value during the N-th estimation period using a second look-up table, wherein the BMS is configured to determine whether to perform a voltage balancing between each of the plurality of battery cells based on the estimated cell voltage value for each of the plurality of battery cells, and wherein the BMS is configured to perform the voltage balancing between the plurality of battery cells based on a determination that the voltage balancing is required.

2. The battery system of claim 1, wherein the first look-up table includes the estimated cell resistance value corresponding to a predetermined cell temperature value, wherein the capacity estimation model is configured to determine the estimated cell capacity corresponding to a predetermined cell current value, and wherein the second look-up table includes a cell voltage value corresponding to a predetermined cell capacity.

3. The battery system of claim 1, wherein the estimated cell capacity corresponds to a State of Charge (SOC).

4. The battery system of claim 2, wherein the cell voltage value corresponds to an Open Circuit Voltage (OCV).

5. A battery system comprising:

a battery including a plurality of battery modules connected in series, each of the plurality of battery modules comprising a plurality of battery cells connected in parallel;

a temperature sensor to measure a cell temperature of each of the plurality of battery cells during a N-th estimation period; and a battery management system (BMS), wherein the BMS is configured to determine an estimated cell resistance value corresponding to a measured cell temperature value by using a first look-up table for each of the plurality of battery cells, wherein the BMS is configured to calculate an estimated cell current value using the estimated cell resistance value and an estimated cell voltage value determined during a (N−1)-th estimation period, N being a natural number greater than or equal to 1, wherein the BMS is configured to determine an estimated cell capacity corresponding to the estimated cell current value by using a capacity estimation model, and wherein the BMS is configured to determine the estimated cell voltage value corresponding to the estimated cell capacity as the estimated cell voltage value during the N-th estimation period using a second look-up table, wherein the BMS is configured to determine whether to perform a module balancing between each of the plurality of battery modules connected in series based on the estimated cell voltage value for each of the plurality of battery cells, and wherein the BMS is configured to perform the module balancing between the plurality of battery modules based on a determination that the module balancing is required.

6. The battery system of claim 5, wherein the BMS is configured to determine a module voltage value of each of the plurality of battery modules based on a minimum cell voltage value among a plurality of cell voltage values of the plurality of battery cells included in each of the plurality of battery modules, and wherein the BMS is configured to determine whether to perform the module balancing based on the module voltage value.

7. The battery system of claim 5, wherein the first look-up table includes a cell resistance value corresponding to a predetermined cell temperature value, wherein the capacity estimation model is configured to determine the estimated cell capacity corresponding to a predetermined cell current value, and wherein the second look-up table includes a cell voltage value corresponding to a predetermined cell capacity.

8. The battery system of claim 5, wherein the estimated cell capacity corresponds to a State of Charge (SOC).

9. The battery system of claim 7, wherein the cell voltage value corresponds to an Open Circuit Voltage (OCV).

10. A method for determining an estimated cell voltage value for each of a plurality of battery cells in a battery system, the battery system including a plurality of battery modules connected in series and the plurality of battery cells connected in parallel in each of the plurality of battery modules, wherein the method comprises:

receiving a measured cell temperature value of each of the plurality of battery cells during a N-th estimation period;

determining an estimated cell resistance value corresponding to the measured cell temperature value by using a first look-up table;

calculating an estimated cell current value using the estimated cell resistance value and an estimated cell voltage value during a (N−1)-th estimation period, N being a natural number greater than or equal to 1;

determining an estimated cell capacity corresponding to the estimated cell current value by using a capacity estimation model;

determining the estimated cell voltage value corresponding to the estimated cell capacity as the estimated cell voltage value using a second look-up table during the N-th estimation period, determining whether to perform a module balancing between the plurality of battery modules based on the estimated cell voltage value for each of the plurality of battery cells, and performing the module balancing between the plurality of battery modules based on a determination that the module balancing is required.

11. The method of claim 10, wherein whether to perform the module balancing is determined based on a minimum cell voltage value, wherein a module voltage value of each of the plurality of battery modules is determined based on a minimum cell voltage value among a plurality of cell voltage values of the plurality of battery cells included in each of the plurality of battery modules, and wherein whether to perform the module balancing is determined based on the module voltage value.

12. The method of claim 11, further comprising, upon determining performing of the module balancing is required, performing the module balancing based on a lowest module voltage value among module voltage values of the plurality of battery modules.

13. The method of claim 10, wherein the first look-up table includes a cell resistance value corresponding to a predetermined cell temperature value, wherein the capacity estimation model determines the estimated cell capacity corresponding to a predetermined cell current value, and the second look-up table includes a cell voltage value corresponding to the predetermined cell capacity.

14. The method of claim 10, wherein the estimated cell capacity corresponds to a State of Charge (SOC).

15. The method of claim 12, wherein the cell voltage value corresponds to an Open Circuit Voltage (OCV).

* * * * *